United States Patent [19]

Ariizumi et al.

[11] Patent Number: 4,760,560
[45] Date of Patent: Jul. 26, 1988

[54] RANDOM ACCESS MEMORY WITH RESISTANCE TO CRYSTAL LATTICE MEMORY ERRORS

[75] Inventors: Shoji Ariizumi, Tokyo; Makoto Segawa; Shigeto Mizukami, both of Yokohama, all of Japan

[73] Assignee: Kabushiki Kaisha Toshiba, Kawasaki, Japan

[21] Appl. No.: 900,517

[22] Filed: Aug. 26, 1986

[30] Foreign Application Priority Data

Aug. 30, 1985 [JP] Japan .................................. 60-191591
Aug. 30, 1985 [JP] Japan .................................. 60-191592

[51] Int. Cl.⁴ ...................... G11C 7/00; G11C 11/34; H01L 27/10; H01L 27/15
[52] U.S. Cl. ...................... 365/189; 365/184; 357/45
[58] Field of Search ............... 365/174, 189, 230, 176, 365/184; 357/45; 307/296 R

[56] References Cited

U.S. PATENT DOCUMENTS

| | | | |
|---|---|---|---|
| 3,836,894 | 9/1974 | Cricchi | 365/176 |
| 4,472,792 | 9/1984 | Shimohigashi et al. | 365/189 |
| 4,577,211 | 3/1986 | Bynum et al. | 307/296 R |
| 4,612,461 | 9/1986 | Sood | 307/296 R |
| 4,636,985 | 1/1987 | Aoki et al. | 365/189 |

Primary Examiner—Terrell W. Fears
Assistant Examiner—Melissa J. Koval
Attorney, Agent, or Firm—Finnegan, Henderson, Farabow, Garrett and Dunner

[57] ABSTRACT

A random access memory comprises a semiconductor body of one conductivity type, at least one first well region of an opposite conductivity type formed in the surface area of the semiconductor body, and a memory cell array having a plurality of memory cells formed in the first well region. A peripheral circuit for driving the memory cell array is formed in at least one second well region of the opposite conductivity type formed separately from the first well region in the surface area of the semiconductor body. The second well region is set at a bias level deeper than the first well region.

5 Claims, 2 Drawing Sheets

RANDOM ACCESS MEMORY WITH RESISTANCE TO CRYSTAL LATTICE MEMORY ERRORS

BACKGROUND OF THE INVENTION

The present invention relates to a random access memory provided with a back-gate bias circuit.

Generally, it is known that it is effective to apply a back-gate bias voltage to a substrate for realization of a high operating speed of an integrated circuit of the MOS type, in particular, an n-channel type MOS integrated circuit. The following effects are obtained due to the application of the back-gate bias voltage.

(i) A depletion layer in the junction between the substrate and the active region extends, so that the junction capacitance is reduced.

(ii) The impurity concentration of the channel stopper can be reduced since the threshold value of a parasitic MOS transistor increases, so that the junction capacitance between the active region and the substrate can be decreased.

(iii) The substrate effect to the threshold value of the MOS transistor can be suppressed.

FIG. 1 shows a back-gate bias circuit which is formed in a substrate and generates a substrate bias voltage VB. This back-gate bias circuit comprises a ring oscillator 1 and a charge pump circuit 2 for applying back-gate bias voltage VB to the substrate in response to an output signal of ring oscillator 1. Charge pump circuit 2 has a capacitor C, one end of which is connected to ring oscillator 1 and n-channel MOS transistors $Q_1$ and $Q_2$, which are connected in series between a substrate terminal ST and the ground, and a connecting point of which is coupled with the other end of capacitor C. Gates of MOS transistors $Q_1$ and $Q_2$ are connected to substrate terminal ST and the connecting point, respectively.

The substrate potential or back-gate bias voltage VB is determined by the relation between a current which is supplied from the back-gate bias circuit to the substrate and a substrate current flowing through the substrate when for example, a memory circuit formed on the same substrate as the back-gate bias circuit operates. Although the current supply capability of the back-gate bias circuit increases in proportion to a power source voltage VC, the substrate current flowing through the substrate when the memory circuit operates exponentially increases with the increase in the power source voltage. Therefore, although back-gate bias voltage VB rises until power source voltage VC reaches a predetermined level (about 6 V) as shown in FIG. 2, when voltage VB becomes higher than voltage level VC, it suddenly decreases.

The back-gate bias circuit provided in a memory circuit such as RAM is designed so as to generate a stable substrate bias voltage for the whole operating range of the power source voltage which is required to drive the memory circuit. Therefore, in the conventional device technology, a bias voltage larger than a reference potential (ground potential) is applied to the whole substrate of the chip.

FIG. 3 shows a cross sectional structure of an n-channel MOS transistor, constituting one of the memory cells in the conventional RAM. This MOS transistor comprises $n^+$-type source and drain regions 4S and 4D formed in the surface area of a p-type silicon substrate 3; and a gate region 5 formed on the channel region between source and drain regions 4S and 4D.

FIG. 4 shows a static memory cell including MOS transistors $Q_3$ and $Q_4$ constituted similarly to the MOS transistor shown in FIG. 3. One end of each of MOS transistors $Q_3$ and $Q_4$ is grounded and their other ends are coupled with a power source terminal VC through resistors $R_1$ and $R_2$, respectively. A node $N_1$ between resistor $R_1$ and MOS transistor $Q_3$ is connected to a gate of MOS transistor $Q_4$ and is also connected through a MOS transistor $Q_5$ to a bit line $BL_0$. A node $N_2$ between resistor $R_2$ and MOS transistor $Q_4$ is connected to a gate of MOS transistor $Q_3$ and is also connected through a MOS transistor $Q_6$ to a bit line $BL_1$. Gates of MOS transistors $Q_5$ and $Q_6$ are connected to a word line WL. In FIG. 3, a polysilicon layer 6 formed on drain region 4D and an insulating layer 7 constitutes the line between node $N_1$ and the gate of MOS transistor $Q_4$ in FIG. 4.

Generally, in the MOS integrated circuit, a crystal defect may occur in silicon substrate 3 in the manufacturing process. As indicated by a point DP in FIG. 3, the crystal defect may be formed in substrate 3 at a position near the junction between substrate 3 and $n^+$-type region 4D. For example, in the case where crystal defect DP is formed at the position in the substrate corresponding to node $N_1$ in a memory cell in the static RAM shown in FIG. 4, the data stored in this memory cell may be destroyed for the following reasons. The potential at node $N_1$ is held at the ground level or power source voltage level when data of "0" or "1" is stored into the memory cell. For instance, the case where power source voltage VC increases in the state in which the potential at node $N_1$ is held at the "1" level will now be considered. In such a case, a higher reverse bias voltage is applied between substrate 3 and $n^+$-type region 4, so that the depletion layer in the junction therebetween may enlarge and reach crystal defect DP. When the depletion layer has reached crystal defect DP in this manner, a leakage current from node $N_1$ to substrate 3 suddenly increases, so that the potential at node $N_1$ decreases. With the reduction in the potential at node $N_1$, the potential at node $N_2$ rises and destroys the data in the memory cell. The back-gate bias circuit is driven by the power source voltage for driving the memory and supplies a fairly deep substrate bias voltage to the substrate within a variation range of the power source voltage for driving the memory. Therefore, in this case, there is the possibility such that the memory data is broken for the foregoing reasons.

SUMMARY OF THE INVENTION

It is an object of the present invention to provide a random access memory which can prevent the data from being broken due to the crystal defect without exerting any adverse influence on the high speed operation.

This object is accomplished by a random access memory comprising a semiconductor substrate of one conductivity type; a first well region of an opposite conductivity type formed in the surface area of the semiconductor substrate, a memory cell array having a plurality of memory cells and formed in the first well region; at least one second well region of the opposite conductivity type formed in the surface area of the semiconductor substrate, a peripheral circuit for driving the memory cell array and formed in the second well region; and back-gate bias circuits for biasing the first well region at a bias level shallower than that of the second well region.

DETAILED DESCRIPTION OF THE PREFERRED EMBODIMENT

A manufacturing process of a random access memory according to an embodiment of the present invention will now be described hereinbelow.

Figure 5A:
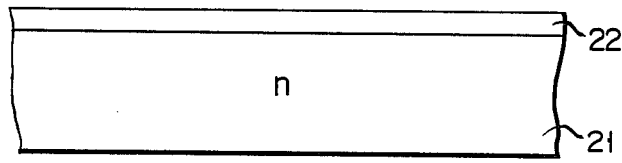
FIGS. 5A to 5D are diagrams showing a manufacturing process of a random access memory according to an embodiment of the present invention.
Figure 5B:
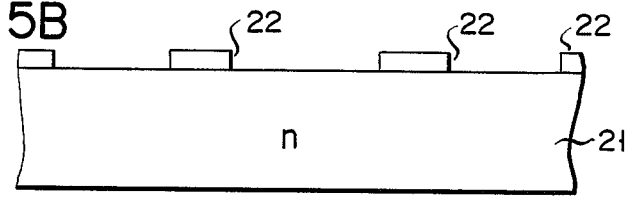
Figure 5C:
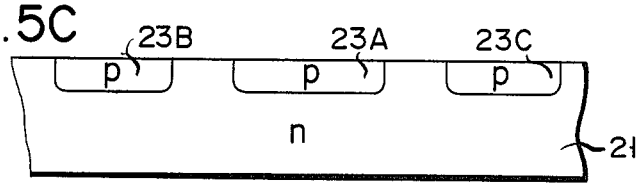
Figure 5D:
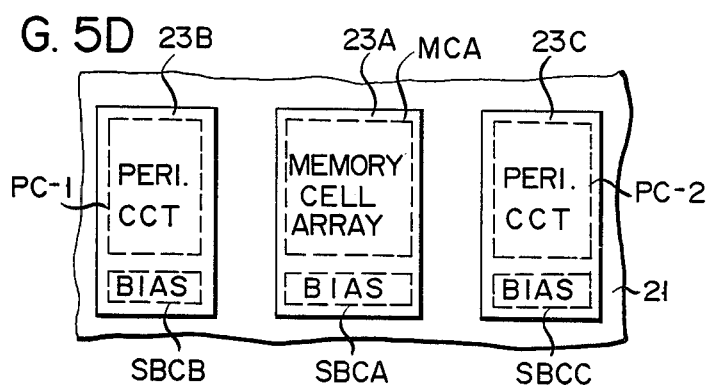

First, as shown in FIG. 5A, an n- or $\pi$-type silicon substrate 21 having a crystal orientation (100) is exposed in the oxidation atmosphere at 900° C., thereby allowing a silicon oxide film 22 having a thickness of about 1700 Å (=0.17 $\mu$m) to be grown on substrate 21. Next, as shown in FIG. 5B, the portions of silicon oxide film 22 corresponding to p-well regions which will be formed in substrate 21 in the post step are selectively removed due to an etching process, thereby partially exposing the surface of substrate 21. Boron of a dose amount of $10^{12}$ cm$^{-2}$ is implanted into the resultant exposed portions of substrate 21 due to ion implantation method. Subsequently, the annealing process is executed at a temperature of 1200° C., thereby forming p-well regions 23A, 23B, and 23C in substrate 21. Thereafter, oxide film 22 is removed from substrate 21.

Figure 4:
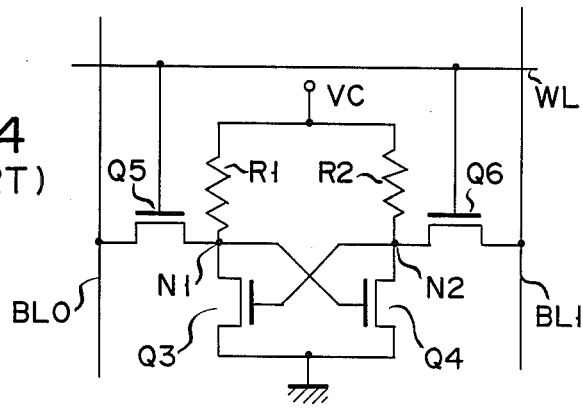
FIG. 4 is a circuit diagram of a memory cell which is conventionally well known.

A memory cell array MCA including a plurality of memory cells, each having n-channel MOS transistors which are formed in a manner similar to that shown in FIG. 4, and a back-gate bias circuit SBCA for applying a back-gate bias voltage to p-well region 23A, are formed in p-well region 23A in a well-known manufacturing method. Peripheral circuits PC-1 and PC-2 such as decoders for driving memory cell array MCA formed in p-well region 23A are formed in p-well regions 23B and 23C, respectively. In addition, back-gate bias circuits SBCB and SBCC for applying back-gate bias voltages to p-well regions 23B and 23C are formed, respectively. Thereafter, interconnection layers for mutually connecting the circuits formed on substrate 21 are formed.

Figure 1:
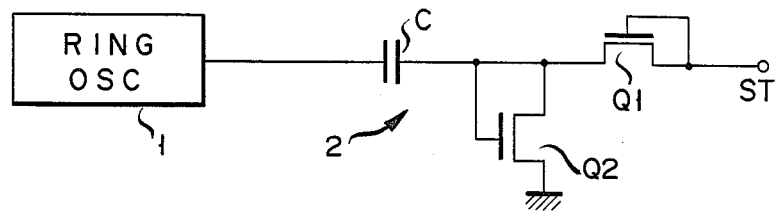
FIG. 1 shows a back-gate bias circuit which has conventionally been used.
Figure 2:
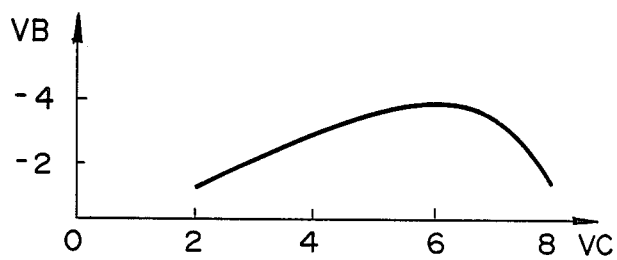
FIG. 2 is a graph showing the relation between the back-gate bias voltage and the power source voltage.
Figure 3:
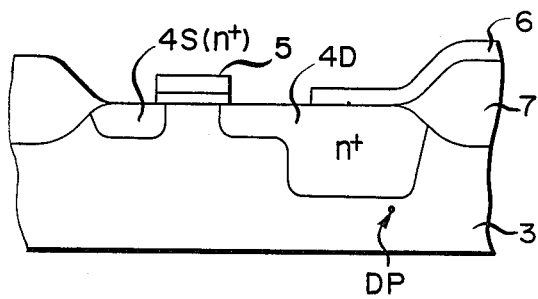
FIG. 3 shows a cross sectional structure of an MOS transistor constituting a memory cell.

Back-gate bias circuits SBCA, SBCB, and SBCC are constituted fundamentally similarly to that shown in FIG. 1. However, although back-gate bias circuit SBCB and SBCC are constituted so as to apply a predetermined negative bias voltage $V_1$ to p-well regions 23B and 23C, respectively, back-gate bias circuit SBCA is constituted so as to apply a bias voltage of, e.g., 0V or a negative bias voltage $V_2$ ($|V_1| > |V_2|$) whose absolute value is smaller than the absolute value of $V_1$ to p-well region 23A. Therefore, when the output bias voltage exceeds $V_2$, for example, the ring oscillator in the back-gate bias circuit SBCA is temporarily stopped to hold p-well region 23A to potential $V_2$. Similarly, when the output bias voltages exceed $V_1$, the ring oscillators in the back-gate bias circuits SBCB and SBCC are temporarily stopped to hold p-well regions 23B and 23C to potential $V_1$.

As described above, in this embodiment, the backgate bias voltage which is shallower than those applied to well regions 23B and 23C in which peripheral circuits PC-1 and PC-2 are formed is supplied to well region 23A in which memory cell array MCA is formed, thereby preventing the data stored in this memory cell array from being broken. On the other hand, since the sufficiently deep back-gate bias voltages are applied to well regions 23B and 23C, peripheral circuits PC-1 and PC-2 can operate at a high speed.

Further, since p-well regions 23A, 23B, and 23C are set to the potential of 0V or negative deep bias potential $V_2$, the potential of silicon substrate 21 can be set to a level of either power source voltage VC or 0V.

Although an embodiment of the present invention has been described above, the invention is not limited to only this embodiment.

For example, in the embodiment, one memory cell array MCA and two peripheral circuits PC-1 and PC-2 have been formed. However, the numbers of memory cell arrays and peripheral circuits are not limited to those values.

On the other hand, although an explanation has been made with respect to the static RAM constituted by n-channel MOS transistors in this embodiment, for instance, a CMOS static RAM can be constituted by CMOS transistors having p-channel MOS transistors formed in n-type substrate 21 and n-channel MOS transistors formed in p-well region 23A.

Moreover, in place of back-gate bias circuits SBCA, SBCB, and SBCC, a back-gate bias circuit for applying a back-gate bias voltage to p-well region 23A and back-gate bias circuits for applying back-gate bias voltages to p-well regions 23B and 23C can be formed at locations remote from p-well regions 23A, 23B, and 23C.

What is claimed is:

1. A random access memory comprising:
    a semiconductor body of one conductivity type having a main surface area;
    at least one first well region of an opposite conductivity type formed in said main surface area;
    a memory cell array having a plurality of memory cells each formed of a plurality of semiconductor regions in said first well region;
    at least one second well region of the opposite conductivity type formed separately from said first well region in said main surface area; and
    a peripheral circuit connected to drive said memory cell array and formed in said second well region;
    said first well region being set at a bias level shallower than that of said second well region.

2. A random access memory according to claim 1, wherein back-gate bias means for setting the bias levels of said first and second well regions are formed in said first and second well regions, respectively.

3. A random access memory according to claim 2, wherein each memory cell in said memory cell array includes a plurality of n-channel MOS transistors.

4. A random access memory according to claim 1, wherein each memory cell in said memory cell array includes a plurality of n-channel MOS transistors.

5. A random access memory comprising:
    a semiconductor body of one conductivity type having a main surface area;
    at least one first well region of an opposite conductivity type formed in said main surface area;
    a memory cell array having a plurality of memory cells formed in said first well region;

a first back-gate bias circuit formed in said first well region to set said first well region at a first bias level;

at least one second well region of the opposite conductivity type formed separately from said first well region in said main surface area;

a peripheral circuit formed in said second well region and connected to drive said memory cell array; and a second back-gate bias circuit formed in said second well region to set said second well region at a second bias level deeper than said first bias level.

* * * * *